US011862591B2

(12) United States Patent
Zhou

(10) Patent No.: US 11,862,591 B2
(45) Date of Patent: Jan. 2, 2024

(54) CONDUCTIVE BUFFER LAYERS FOR SEMICONDUCTOR DIE ASSEMBLIES AND ASSOCIATED SYSTEMS AND METHODS

(71) Applicant: Micron Technology, Inc., Boise, ID (US)

(72) Inventor: Wei Zhou, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 153 days.

(21) Appl. No.: 17/411,229

(22) Filed: Aug. 25, 2021

(65) Prior Publication Data
US 2023/0063954 A1    Mar. 2, 2023

(51) Int. Cl.
*H01L 23/48* (2006.01)
*H01L 23/52* (2006.01)
(Continued)

(52) U.S. Cl.
CPC .............. *H01L 24/08* (2013.01); *H01L 24/03* (2013.01); *H01L 24/05* (2013.01); *H01L 24/80* (2013.01);
(Continued)

(58) Field of Classification Search
CPC ......... H01L 24/08; H01L 24/03; H01L 24/05; H01L 247/80; H01L 2224/0219;
(Continued)

(56) References Cited

U.S. PATENT DOCUMENTS 9,888,584 B2 * 2/2018 Wang ................ H05K 1/111
2013/0252399 A1    9/2013 Leduc
(Continued)

FOREIGN PATENT DOCUMENTS

JP    H05267394 A  * 10/1993
JP    2002236459 A *  8/2002

OTHER PUBLICATIONS

Roy, N.K. et al., "A novel microscale selective laser sintering (μ-SLS) process for the fabrication of microelectronic parts", Microsystems & Nanoengineering 5:64 (2019), 14 pages; https://doi.org/10.1038/s41378-019-0116-8.
(Continued)

*Primary Examiner* — Niki H Nguyen
(74) *Attorney, Agent, or Firm* — Perkins Coie LLP

(57) ABSTRACT

Conductive buffer layers for semiconductor die assemblies, and associated systems and methods are disclosed. In an embodiment, a semiconductor die assembly includes first and second semiconductor dies directly bonded to each other. The first semiconductor die includes a first copper pad and the second semiconductor die includes a second copper pad. The first and second copper pads form an interconnect between the first and second semiconductor dies, and the interconnect includes a conductive buffer material between the first and second copper pads, where the conductive buffer material includes aggregates of conductive particles. In some embodiments, the first and second copper pads are not conjoined but electrically connected to each other through the conductive buffer material. In some embodiments, the conductive buffer material is porous such that the aggregates of conductive particles can be compressed together in response to the pressure applied to the conductive buffer layer.

18 Claims, 9 Drawing Sheets

(51) Int. Cl.
*H01L 29/40* (2006.01)
*H01L 23/00* (2006.01)
(52) U.S. Cl.
CPC .............. *H01L 2224/0219* (2013.01); *H01L 2224/03821* (2013.01); *H01L 2224/05647* (2013.01); *H01L 2224/08145* (2013.01); *H01L 2224/80895* (2013.01); *H01L 2224/80896* (2013.01)
(58) Field of Classification Search
CPC . H01L 2224/03821; H01L 2224/05647; H01L 2224/08145; H01L 2224/80895; H01L 2224/80896; H01L 2224/48228; H01L 2224/48465; H01L 2224/49113; H01L 23/31; H01L 2924/014; H01L 2224/16; H01L 24/06; H01L 23/49524; H01L 2224/32227; H01L 2224/73204; H01L 2924/0665; H01L 24/81; H01L 2224/48227; H01L 2224/838; H01L 2224/73203; H01L 2924/15311; H01L 2224/81801; H01L 27/156; H01L 2225/06517; H01L 2224/04026; H01L 2224/32148; H01L 24/16; H01L 23/49811; H01L 2225/06541; H01L 2225/06513; H01L 24/10; H01L 24/02; H01L 2224/02; H01L 2224/0401; H01L 2224/05022; H01L 2224/0615; H01L 2224/1134; H01L 2224/16147; H01L 2224/16227; H01L 2224/16238; H01L 2224/29026; H01L 2224/32145; H01L 2224/81191; H01L 24/09; H01L 25/0655; H01L 25/162
See application file for complete search history.

(56) References Cited

U.S. PATENT DOCUMENTS

2016/0351530 A1   12/2016   Gandhi et al.
2020/0258859 A1   8/2020   Tuttle et al.

OTHER PUBLICATIONS

Shirakawa, N. et al., "Fine Pitch Copper Wiring Formed with Super-Inkjet and the Oxygen Pump", Japanese Journal of Applied Physics 52 (2013), 3 pages; DOI:10.7567/JJAP.52.05DB19.
TW Patent Application No. 111126587—Taiwanese Office Action and Search Report, dated Apr. 28, 2023, with English Translation, 20 pages.

* cited by examiner

300A

300B

CONDUCTIVE BUFFER LAYERS FOR SEMICONDUCTOR DIE ASSEMBLIES AND ASSOCIATED SYSTEMS AND METHODS

TECHNICAL FIELD

The present disclosure generally relates to semiconductor device assemblies, and more particularly relates to conductive buffer layers for semiconductor die assemblies and associated systems and methods.

BACKGROUND

Semiconductor packages typically include one or more semiconductor dies (e.g., memory chips, microprocessor chip, imager chip) mounted on a package substrate and encased in a protective covering. The semiconductor die may include functional features, such as memory cells, processor circuits, or imager devices, as well as bond pads electrically connected to the functional features. The bond pads can be electrically connected to corresponding conductive structures of the package substrate, which may be coupled to terminals outside the protective covering such that the semiconductor die can be connected to higher level circuitry.

In some semiconductor packages, two or more semiconductor dies are stacked on top of each other to reduce the footprint of the semiconductor packages. The semiconductor dies in the stack may be arranged in a pattern resembling stair-steps (which may be referred to as "shingle stacking") such that a portion of the semiconductor dies may be freely accessible—e.g., to attach bond wires to one or more bond pads located in the portion. In some cases, the semiconductor dies may be stacked in a "zig-zag" pattern to increase a space above the bond pads with respect to a semiconductor die overlying above the bond pads so as to facilitate forming the bond wires. Such arrangements, however, tend to increase overall heights of the semiconductor packages. Further, the bond wires may add to the heights and/or introduce delays in signal propagation.

BRIEF DESCRIPTION OF THE DRAWINGS

Many aspects of the present technology can be better understood with reference to the following drawings. The components in the drawings are not necessarily to scale. Instead, emphasis is placed on clearly illustrating the overall features and the principles of the present technology.

DETAILED DESCRIPTION

Figure 1:
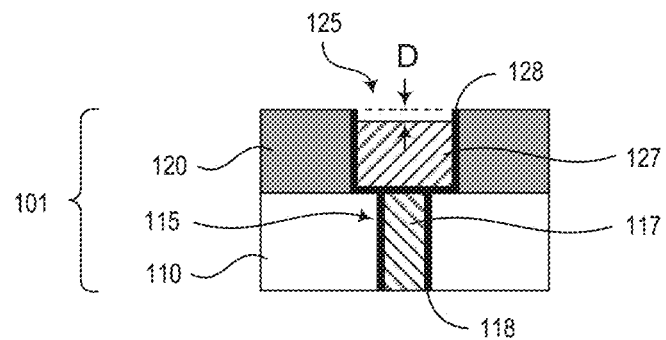
FIG. 1 illustrates various stages of process steps for direct bonding schemes.
Figure 1:
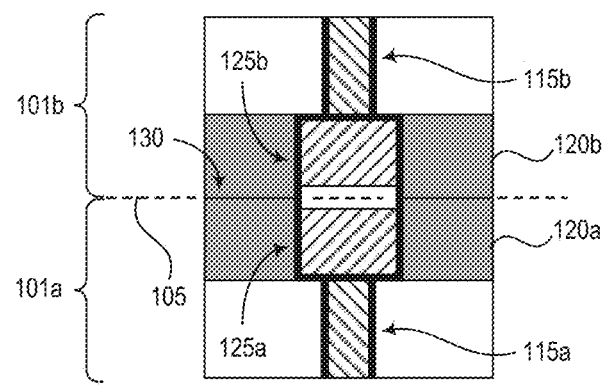
Figure 1:
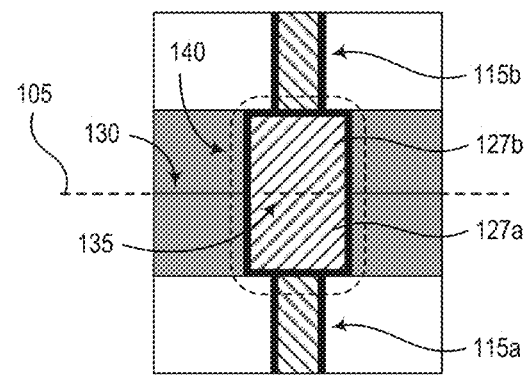

Specific details of several embodiments of conductive buffer layers for semiconductor die assemblies, and associated systems and methods are described below. The term "semiconductor device or die" generally refers to a solid-state device that includes one or more semiconductor materials. Examples of semiconductor devices (or dies) include logic devices or dies, memory devices or dies, controllers, or microprocessors (e.g., central processing unit (CPU), graphics processing unit (GPU)), among others.

Such semiconductor devices may include integrated circuits or components, data storage elements, processing components, and/or other features manufactured on semiconductor substrates. Further, the term "semiconductor device or die" can refer to a finished device or to an assembly or other structure at various stages of processing before becoming a finished functional device. Depending upon the context in which it is used, the term "substrate" may include a semiconductor wafer, a package substrate, an interposer, a semiconductor device or die, or the like. Suitable steps of the methods described herein can be performed with processing steps associated with fabricating semiconductor devices (wafer-level and/or die-level) and/or manufacturing semiconductor packages.

Various computing systems or environments, e.g., high-performance computing (HPC) systems, require high bandwidth and low power consumption. Certain schemes of forming interconnects between semiconductor dies (e.g., a direct bonding scheme) may facilitate satisfying the requirements, as well as providing form-factors suitable for scaling physical dimensions (e.g., heights) of semiconductor die assemblies of the HPC systems. The direct bonding scheme includes individual conductive components (e.g., copper pads, conductive pads, bond pads) of a first semiconductor die (or a first wafer including the first semiconductor die) aligned and directly bonded to corresponding one of conductive components of a second semiconductor die (or a second wafer including the second semiconductor die).

Further, a dielectric material surrounding each of the conductive pads of the first semiconductor die can be directly bonded to another dielectric material surrounding each of the conductive pads of the second semiconductor die. In other words, the bonding interface includes two or more dissimilar materials of the first semiconductor die directly bonded to corresponding materials of the second semiconductor die (e.g., between dielectric materials, between conductive materials) to form interconnects and surrounding dielectric layers. As such, the direct bonding scheme may also be referred to a combination bonding scheme, a hybrid bonding scheme, or the like.

In some embodiments, the conductive materials include copper (or other suitable conductive materials or metals, such as tungsten, aluminum, or gold) as a primary constituent, and the dielectric materials include silicon oxides (e.g., $SiO_2$), silicon nitrides (e.g., $Si_3N_4$), silicon carbon nitrides (e.g., SiCN), silicon carbonates (e.g., SiCO), or the like. During the direct bonding process, the dielectric materials of the first and second semiconductor dies (or the first and second wafers including the first and second semiconductor dies) are brought together such that the dielectric materials adhere to each other and hermetically seal the conductive components aligned to each other.

Subsequently, the semiconductor dies are annealed at an elevated temperature (e.g., post bond annealing process) such that the conductive materials of the conductive pads can expand—e.g., swell vertically toward the bonding interface—at least partially due to the differences in coefficients of thermal expansion (CTE) between the conductive materials and the dielectric materials. This phenomenon may be referred to as CTE-based expansion of the conductive pads.

Eventually, the conductive materials are conjoined to form permanent bonding between them—e.g., metallurgical bonding. Additionally, the dielectric materials may enhance their bonding strength during the post bond annealing process. In some embodiments, the post bond annealing process can be carried out at approximately 250° C. for 2 hours or so.

In some embodiments, the conductive pads have recessed surfaces with respect to the surface of the dielectric materials. In this manner, when the dielectric materials of the semiconductor dies adhere to each other (e.g., prior to the post bond annealing process), bonding of the dielectric materials can be accomplished without any interference from protruded conductive pads. Further, the recess amount (e.g., a depth of recess, a recess depth, a dishing amount) for the conductive pads may be devised and controlled to be within a certain range. The recess amount may determine whether the conductive materials (e.g., copper) can be suitably conjoined to each other during the post bond annealing process without compromising the bonding strength or the interconnect characteristics.

For example, if the recess depths of the conductive pads are insufficient (e.g., too shallow), the conductive materials, during the annealing process, may expand to pry open (e.g., pull apart, delaminate) the bonding interface between the dielectric materials, at least in the region proximate to the conductive pads—e.g., resulting in oxide openings. On the other hand, if the recess depths are excessive (e.g., too deep), the conductive materials, during the annealing process, may not be sufficiently conjoined to each other to form robust interconnects—e.g., resulting in resistive copper joints or copper joints openings.

Accordingly, controlling the recess depths may affect yield or reliability of the direct bonding process, and tends to impose strict requirements to various process conditions and/or design factors. For example, conductive pads may be designed (e.g., laid out) to have widths (or lengths) of certain ranges to reduce variations in the recess depths. In some embodiments, the conductive pads may be partitioned or be surrounded with dummy pads to satisfy certain areal density requirements.

In some cases, elaborate targeting of the recess depths may be carried out to determine suitable process conditions—e.g., over-polish targeting during chemical-mechanical polish (CMP) process steps used to generate the conductive pads. Even so, statistical random process variations (e.g., life of CMP pads, variations in CMP slurries) may present challenges to the recess depth control. In some embodiments, variations in the recess depths need to be less than ±5 nanometers (nm) across the entire wafer (e.g., across 300 mm diameter of the wafer). The variations in the recess depths may be referred to as a coplanarity of the conductive pads and maintaining the coplanarity of the conductive pads within a tolerable limit (e.g., within ±5 nm) may increase cost for the semiconductor die assemblies.

The present technology provides for conductive buffer layers to facilitate relaxing the recess depth requirements—i.e., widening the tolerable limits for the conductive pads coplanarity for hybrid bonding schemes. Such conductive buffer layers can be disposed between the conductive pads before two or more semiconductor dies are attached to each other during the hybrid bonding process. In some embodiments, the conductive buffer layer is porous and includes conductive particles—e.g., copper particles, silver particles, gold particle, nickel particles, or other suitable conductive nanoparticles. In some embodiments, the conductive particles have diameters of approximately 15 nm to 50 nm.

In some embodiments, the conductive buffer layer is flexible (e.g., malleable, squeezable, elastic, compressible, or otherwise adaptable) under pressure applied to the conductive buffer layer. In response to the pressure applied to the conductive buffer layer (e.g., when the conductive pads expand into the conductive buffer layer responsive to thermal energy applied to the conductive pads), the conductive buffer layer may deform (e.g., as a result of conductive particles transporting to regions with relatively less pressure). Additionally, or alternatively, the conductive particles may be brought closer to one another or be compressed together (e.g., migrating within the conductive buffer layer) such that the conductive buffer layer occupies less volume. As such, the conductive buffer layer may become less porous as a result of being subject to the pressure.

In some embodiments, in response to receiving thermal energy (e.g., during the post bond annealing process at 250° C. for 2 hours) and/or being subject to the pressure, the conductive particles may coalesce (e.g., aggregate, merge, fuse, amalgamate) to form electrically conductive structures (e.g., similar to sintered metal). In a particular embodiment, the post bond annealing process provides sintering for the conductive particles. The electrically conductive structures may be porous in their nature. In some embodiments, the electrically conductive structures have porosity of approximately 30%, which is expected to have no significant effect on the electrical conductivity. Moreover, the porosity of the electrically conductive structures may vary based on the thermal energy (e.g., post bond annealing temperature or time) and/or the magnitude of pressure (e.g., due to variations in the recess depths) applied to the conductive particles. In some embodiments, the electrically conductive structures includes the porosity of 30±10%. In other embodiments, the electrically conductive structures includes the porosity of less than 20%.

In view of the conductive buffer layer present between the upper and lower conductive pads to be directly bonded, the recess depths can be targeted to be relatively aggressive—e.g., generating generally greater recess amounts when compared to the recess depths absent the conductive buffer layer. In this manner, when the conductive pads expand, e.g., during the post bond annealing process, the conductive buffer layer can provide a squeezable cushion (e.g., a buffer region, compressible room) against the rigid conductive pads bumping into each other—e.g., when one or more conductive pads have recess depths inadequately shallow tending to result in oxide openings without the conductive buffer layer. Alternatively, the conductive buffer layer can provide an electrically conductive medium between the conductive pads even if the conductive pads do not physically connect to each other after completing the post bond annealing process—e.g., when one or more conductive pads have recess depths inadequately deep tending to result in resistive copper joints or copper joints openings without the conductive buffer layer.

As used herein, the terms "front," "back," "vertical," "lateral," "down," "up," "top," "bottom," "upper," and "lower" can refer to relative directions or positions of features in the semiconductor device assemblies in view of the orientation shown in the Figures. For example, "upper" or "uppermost" can refer to a feature positioned closer to the top of a page than another feature. These terms, however, should be construed broadly to include semiconductor devices having other orientations. Unless stated otherwise, terms such as "first" and "second" are used to arbitrarily distinguish between the elements such terms describe. Thus, these terms are not necessarily intended to indicate temporal or other prioritization of such elements.

FIG. 1 illustrates various stages of process steps for direct bonding schemes. Diagram 100A illustrates a portion of a semiconductor die 101 with a substrate 110 having integrated circuitry (not shown) and a through-substrate via (TSV) 115 coupled with the integrated circuitry. In some embodiments, the TSV 115 includes a first conductive material 117 (e.g., tungsten) and a conductive barrier layer 118 (e.g., TiN). The semiconductor die 101 also includes a conductive pad 125 (which may also be referred to as a bond pad) formed in a dielectric layer 120 (e.g., silicon oxides, silicon nitrides, silicon carbon nitrides, silicon carbonates, or a combination thereof). The conductive pad 125 is electrically connected to the TSV 115 (and to the integrated circuitry through the TSV 115). In some embodiments, the conductive pad 125 includes a second conductive material 127 (e.g., copper) and another conductive barrier layer 128 (e.g., TaN).

The conductive pad 125 depicted in diagram 100A includes a surface recessed by a depth D with respect to the surface of the dielectric layer 120 (i.e., the surface opposite to the substrate 110). In some embodiments, CMP process steps are used to form the conductive pad 125, and the recess may be a result of the CMP process. For example, the recess may be formed during over-polishing steps that remove excessive conductive material 127 on the surface of the dielectric layer 120. Moreover, the amount of recess (e.g., the recess depth D) may be targeted to ensure the surface of the conductive pad 125 not to protrude above the surface of the dielectric layer 120—e.g., to avoid such protruded conductive pads 125 interfering with the bonding process described with reference to diagram 100B. The amount of recess may be targeted to be within a certain range such that the conductive materials 127 can form an interconnect 140 without compromising overall bonding integrity as described with reference to diagram 100C.

Diagram 100B illustrates two semiconductor dies 101a and 101b (or two wafers including the semiconductor dies 101a and 101b) that are attached together such that dielectric materials of the top semiconductor die 101b and bottom semiconductor die 101a adhere to each other to form dielectric-to-dielectric bonding 130 at the bonding interface 105. In some embodiments, the dielectric surfaces are activated (e.g., using a plasma treatment process) to facilitate the bonding of the dielectric surfaces. Also, conductive pads (e.g., the top conductive pad 125b and the bottom conductive pad 125a) of the top and bottom semiconductor dies 101a and 101b are aligned to face each other but are not connected to each other due to the recessed surfaces of the conductive pads 125a/b.

Diagram 100C illustrates that the bonded dies/wafers are annealed in an elevated temperature (e.g., around 400° C.) such that the conductive materials of the top and bottom conductive pads 125a/b may expand toward each other in response to receiving thermal energy during the post bond annealing process (e.g., due to the mismatch in CTEs between the conductive materials and the dielectric materials) within the open space defined by the recess surfaces and the dielectric material surrounding the conductive pads 125a/b.

When the surfaces of the top and bottom conductive materials are in contact as a result of the CTE-based expansion, the conductive materials are conjoined (e.g., via atomic migration (intermixing, diffusion) from one conductive material to another conductive material) to form metal-to-metal bonding 135—e.g., metallurgical bonding, permanent bonding. Once the metallurgical bonding is formed between the conductive pads 125a/b (thus, forming the interconnect 140), the conductive materials do not separate (or sever) when the bonded dies/wafers are brought to the ambient temperature or operating temperatures of the semiconductor die assemblies. In this manner, the bonding interface 105 includes the dielectric-to-dielectric bonding 130 and the metal-to-metal bonding 135.

Figure 2A:
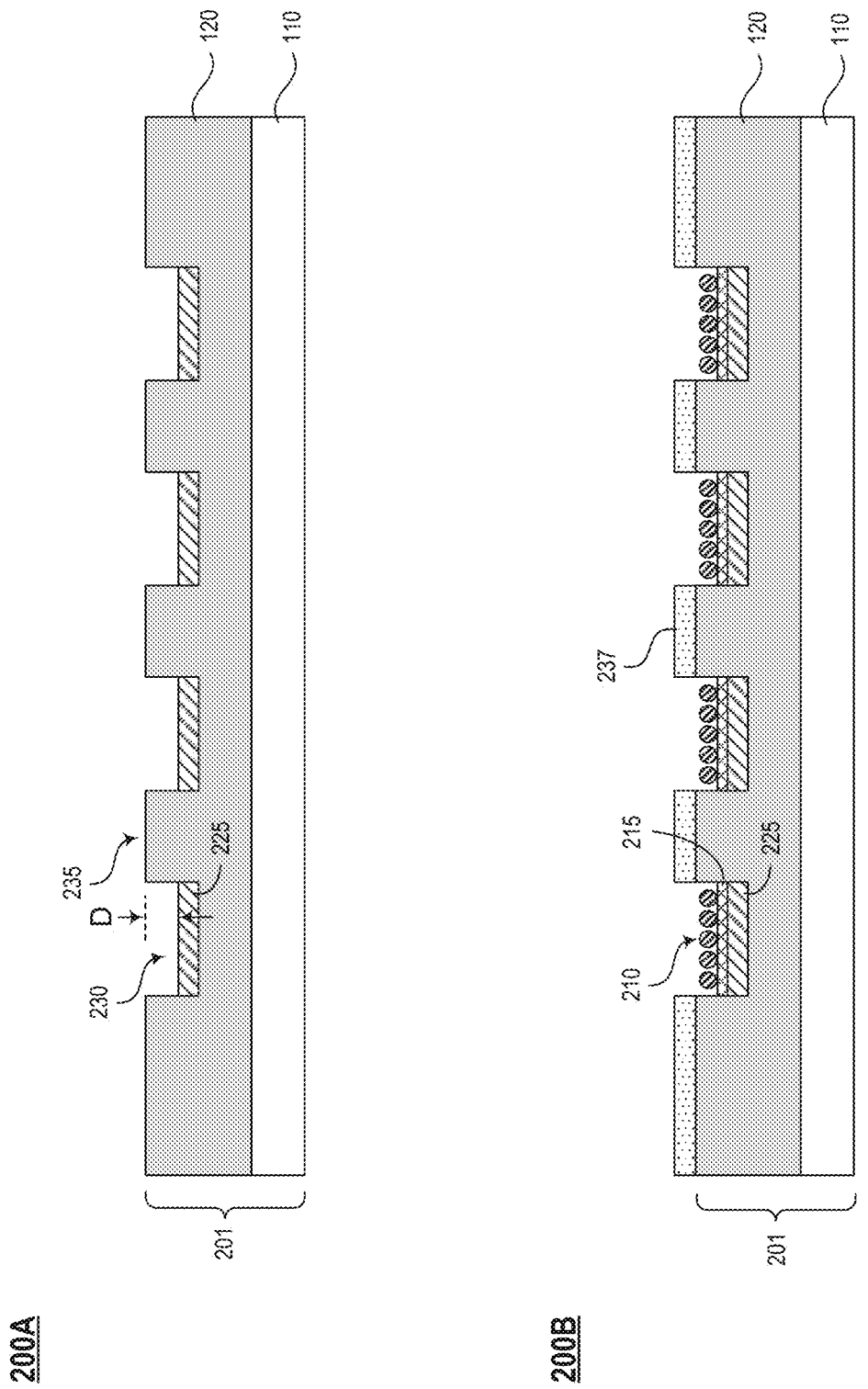
FIGS. 2A-B and 3A-C illustrate schematic diagrams depicting stages of processes forming semiconductor die assemblies in accordance with embodiments of the present technology.
Figure 2B:
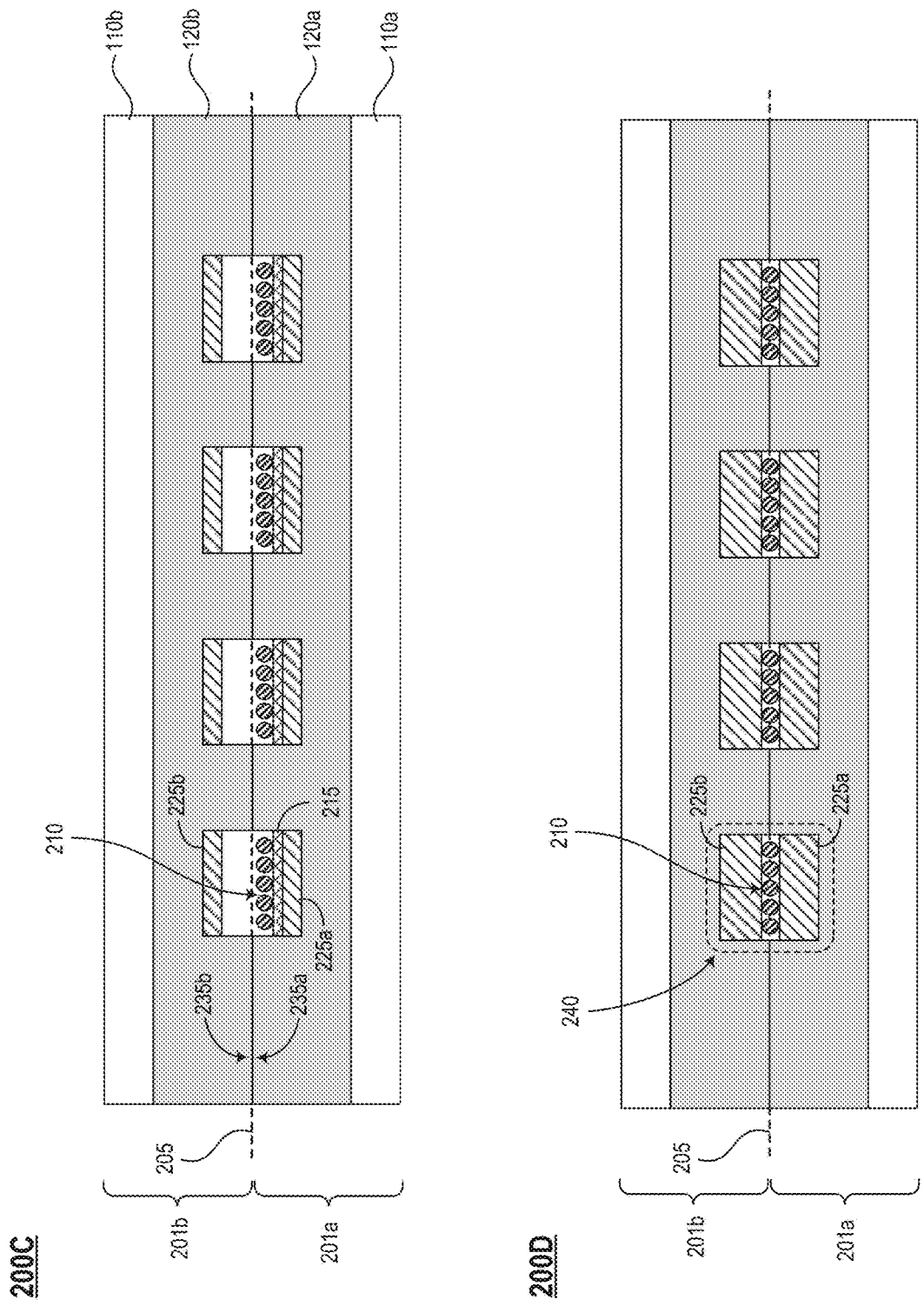

FIGS. 2A-B illustrate schematic diagrams 200A through 200D depicting stages of a process forming semiconductor die assemblies in accordance with embodiments of the present technology. Diagram 200A illustrates a portion of a semiconductor die 201, which may be an example of or include aspects of the semiconductor die 101 described with reference to FIG. 1. For example, the semiconductor die 201 includes the substrate 110 having integrated circuitry (not shown) and the dielectric layer 120.

The semiconductor die 201 also includes one or more conductive pads 225 formed in the dielectric layer 120. The conductive pads 225 may be examples of or include aspects of the conductive pads 125 described with reference to FIG. 1. The TSVs 115 coupling the conductive pads 225 to the integrated circuitry are omitted in FIGS. 2A-B. The conductive pad 225 has a surface 230 recessed with respect to a surface 235 of the dielectric layer 120 (the amount of recess denoted as D)—e.g., as a result of the CMP process described with reference to FIG. 1. As shown in diagram 200A, the surface of the conductive pad 225 is uncovered (i.e., exposed) at this stage of the process.

Diagram 200B illustrates a conductive buffer layer 210 formed on the conductive pads 225. Also illustrated in diagram 200B are an optional sacrificial layer 215 between the conductive pads 225 and the conductive buffer layer 210 and an optional mask 237 on the surface 235 of the dielectric layer 120. In some embodiments, the conductive buffer layer 210 adheres to the sacrificial layer 215. As such, the sacrificial layer 215 may be regarded as a tacky layer (or an adhesion layer) for the conductive buffer layer 210. In some embodiments, the sacrificial layer 215 includes flux that protects the surface 230 of the conductive pads 225 from oxidation. In some embodiments, the sacrificial layer 215 is configured to decompose at an elevated temperature—e.g., at a temperature of about 100° C. or greater. In some embodiments, the sacrificial layer 215 forms only on the conductive pads 225 using masked deposition process steps—e.g., using a mask layer (e.g., a photoresist layer, a hard-mask layer) on the surface 235 of the dielectric layer 120, which includes openings corresponding to the conductive pads 225.

In some embodiments, the conductive buffer layer 210 may be formed on the conductive pads 225 based on depositing conductive particles (e.g., copper particles) over the conductive pads 225 while blocking the conductive particles from depositing on the surface 235 of the dielectric layer 120 unoccupied by the conductive pads 225. In some embodiments, screen-printing techniques is used to deposit the conductive particles over the conductive pads 225 only. In other embodiments, masked deposition techniques is used to deposit the conductive particles over the conductive pads 225 only. In some embodiments, the conductive particles deposited over the conductive pads 225 may be sintered at an elevated temperature (e.g., 100° C. or greater).

In some embodiments, the conductive buffer layer 210 may be formed on the conductive pads 225 based on selectively sintering conductive particles that have been disposed over the conductive pads 225. For example, a layer of liquid including conductive particles is coated on the semiconductor die 201 (e.g., on the surface 230 of the conductive pads 225 and on the surface 235 of the dielectric layer 120). Subsequently, precision electromagnetic radiation (e.g., laser) may be used to selectively sinter the conductive particles on the conductive pads 225 only. Thereafter, the un-sintered conductive particles are removed (e.g., from the surface 235 of the dielectric layer 120).

In some embodiments, the conductive buffer layer 210 may be formed on the conductive pads 225 based on selectively spraying a solution including conductive particles (e.g., copper nanoparticle ink) over the conductive pads 225. For example, the copper nanoparticle ink can be directly sprayed on the surface 230 of the conductive pads 225 using a precision nozzle. Subsequently, the copper nanoparticle ink deposited over the conductive pads 225 may be sintered at an elevated temperature (e.g., 100° C. or greater).

In some embodiments, while the conductive buffer layer 210 is formed on the conductive pads 225, the optional mask 237 (e.g., a photoresist, a hard-mask of organic and/or inorganic materials) is deployed on the surface 235 of the dielectric layer 120. After the conductive buffer layer 210 has been formed only on the conductive pads 225, the mask 237 is removed. In this manner, the surface 235 of the dielectric layer 120 can be protected during the various process steps associated with forming the conductive buffer layer 210 on the conductive pads 225.

Further, during the sintering process steps, the conductive particles may be protected from oxidation. For example, oxygen pumping (to minimize oxygen partial pressure in the ambient) may be used during the sintering process. In some instances, the sintering may be carried out in a $H_2$ ambient. In some cases, oxides formed on the surface of conductive particles can be reduced (or removed) using formic acid cleaning.

Diagram 200C illustrates two semiconductor dies 201 (also identified individually as semiconductor dies 201a and 201b) that are attached together to form the bonding interface 205 as described with reference to FIG. 1 (e.g., diagram 100B). In a particular aspect of an embodiment shown in diagram 200C, the lower (bottom) semiconductor die 201a includes the conductive buffer layer 210 and the optional sacrificial layer 215 while the upper (top) semiconductor die 201b does not. In a further particular aspect of this embodiment, the surface 235a of dielectric layer 120a of the semiconductor die 201a is in contact with the surface 235b of dielectric layer 120b of the semiconductor die 201b forming the dielectric-to-dielectric bonding at the bonding interface 205.

As shown in diagram 200C, two semiconductor dies 201a and 201b are arranged such that the conductive pads 225 (also identified individually as conductive pads 225a/b) of the semiconductor dies 201a and 201b are aligned to each other—e.g., the conductive pad 225a aligned to the conductive pad 225b. Subsequently, the semiconductor dies 201a and 201b (or the wafers including the semiconductor dies 201a and 201b) are brought to an elevated temperature (e.g., post bond annealing process steps) to facilitate the CTE-based expansion of the conductive pads 225.

Diagram 200D illustrates that interconnects 240 are formed—e.g., as a result of the post bond annealing process. In other words, the conductive pads 225a and 225b expand upon receiving thermal energy at the elevated temperature (e.g., during the post bond annealing process) such that the surfaces 230 of the conductive pads 225a and 225b advance toward the bonding interface 205. Moreover, the sacrificial layer 215 may decompose subject to the thermal energy (e.g., during the post bond annealing process). Accordingly, the sacrificial layer 215 is omitted in the diagram 200D.

In some embodiments, the conductive buffer layer 210 allows a wider range of variations in the recess depths—e.g., widening a tolerable limit for the coplanarity of the conductive pads 225. For example, the coplanarity of the conductive pads 225 may be required to be within ±5 nm absent the conductive buffer layer 210. With the conductive buffer layer 210 included in at least one of the semiconductor dies 201a/b, the tolerable limit for the coplanarity of the conductive pads 225 may be widened (e.g., increased, relaxed) to a greater value, such as ±7 nm, ±10 nm, ±15 nm, or even greater.

As a result of using the conductive buffer layer 210, the interconnects 240 include a conductive buffer material (i.e., conductive buffer material included in the conductive buffer layer 210) in addition to the conductive pads 225—e.g., between the conductive pads 225a/b. In some embodiments, the conductive buffer layer is less dense than the upper and lower conductive pads 225 (e.g., copper pads formed by electroplating process steps). Although the diagram 200D illustrates the conductive buffer layer 210 generally in a plane corresponding to the bonding interface 205, locations of the conductive buffer layer 210 may vary with respect to the bonding interface 205 in view of varying recess depths of the conductive pads 225 as described in more detail with reference to FIG. 4. Further, the conductive buffer layer 210 may be discontinuous at certain locations—e.g., the interconnects 240 may include a portion where the conductive pads 225 from the lower and upper semiconductor dies 201a/b forming direct metal-to-metal bonding.

Although the foregoing example schematic diagrams illustrate only one of semiconductor dies 201a or 201b having the conductive buffer layer 210, the present technology is not limited thereto. For example, both of the semiconductor dies 201a and 201b can include the conductive buffer layer 210.

Figure 3A:
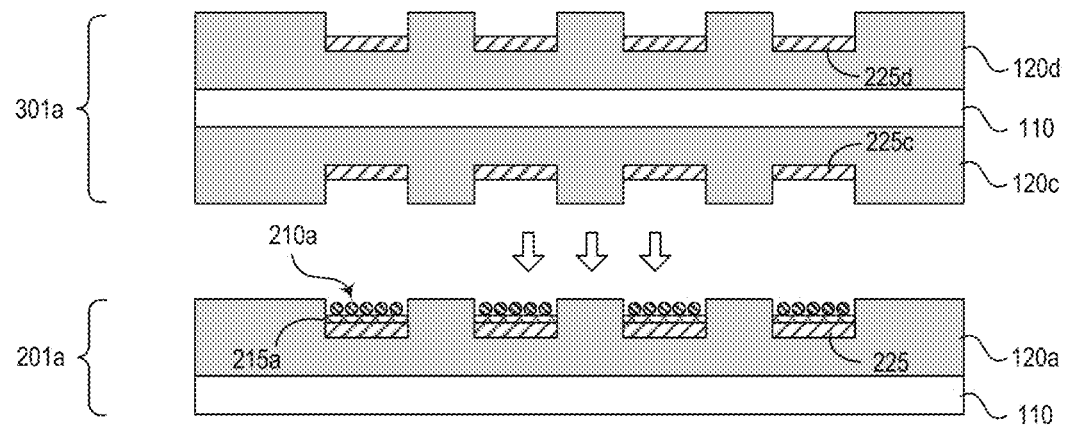
Figure 3A:
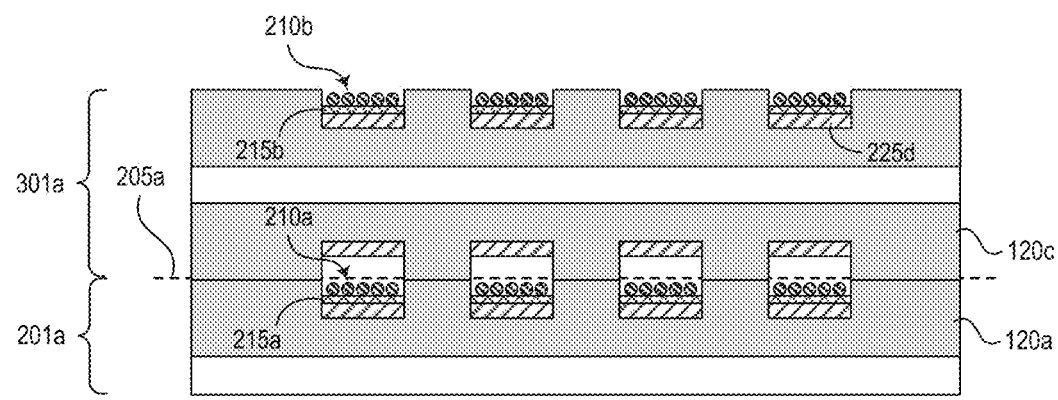
Figure 3B:
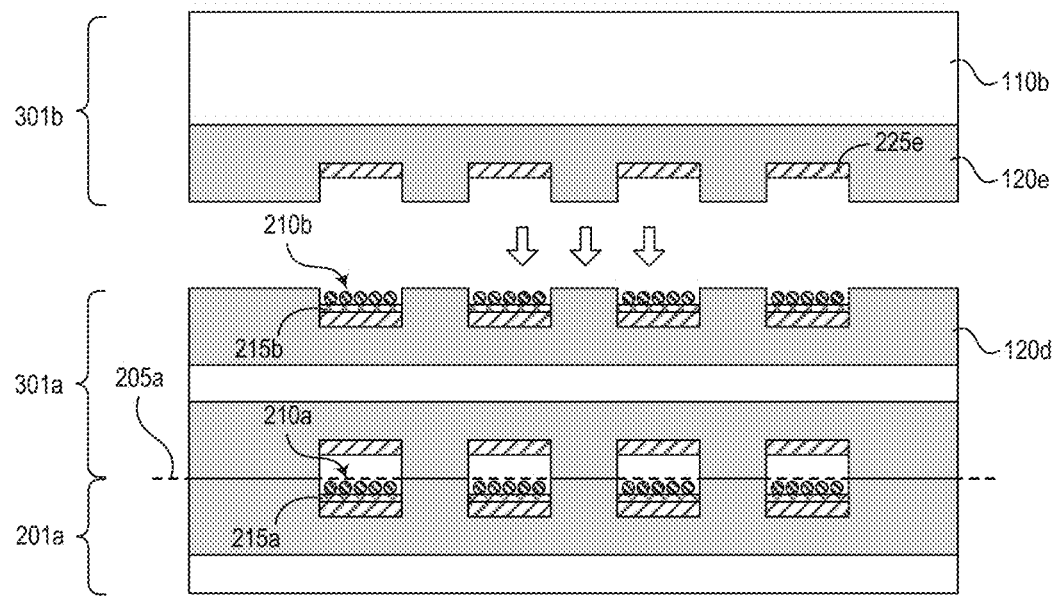
Figure 3B:
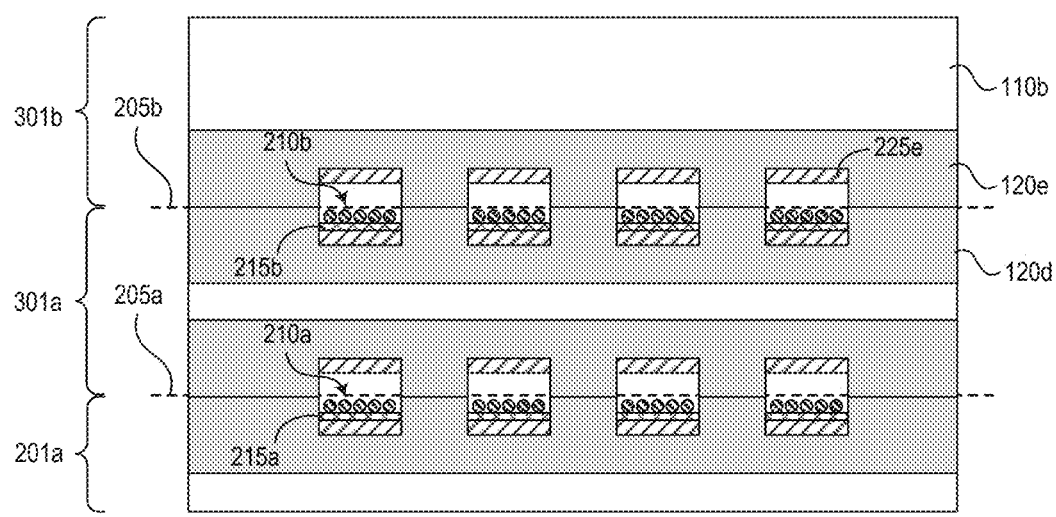
Figure 3C:
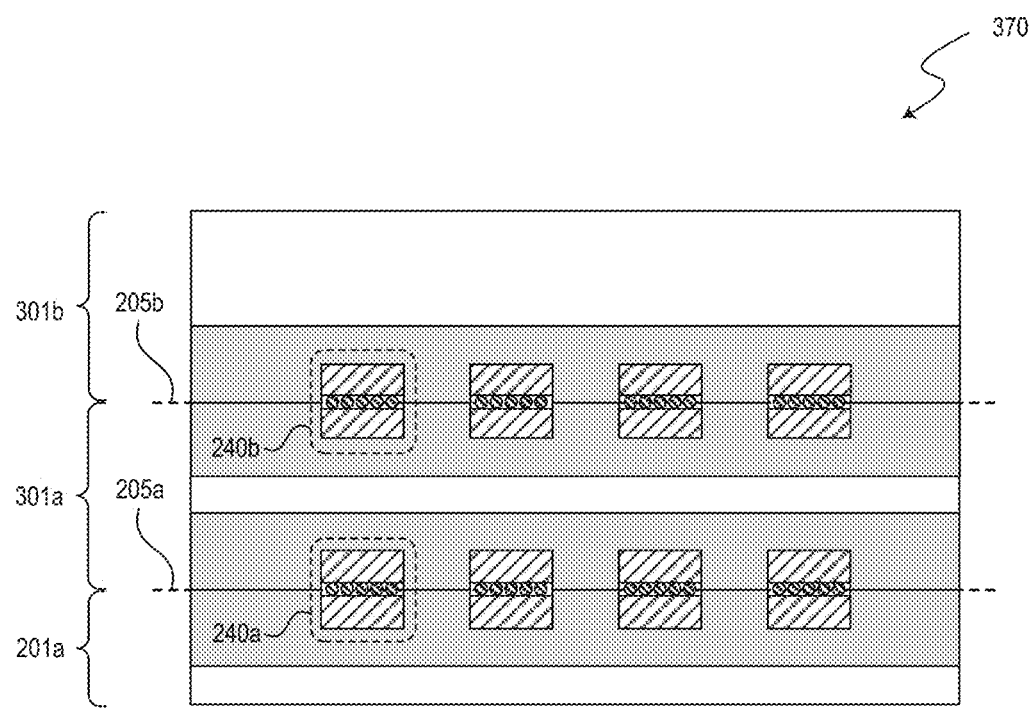

FIGS. 3A-C illustrate schematic diagrams 300A through 300E depicting stages of a process forming semiconductor die assemblies in accordance with embodiments of the present technology. Diagram 300A illustrates the semiconductor die 201a after the conductive buffer layer 210a has been formed on the conductive pads 225 as described with reference to the diagram 200B. In some embodiments, the semiconductor die 201a is the same type of semiconductor die as the semiconductor dies (e.g., memory dies) that the semiconductor die 201a carries (e.g., semiconductor die 201b, semiconductor dies 301a/b). In other embodiments, the semiconductor die 201a is an interface die.

The interface die may be different types of semiconductor dies (e.g., logic dies, controller dies) than the semiconductor dies that the semiconductor die 201a carries. In some embodiments, a logic die is configured to exchange electrical signals with the semiconductor dies it carries and with higher level circuitry (e.g., a host device) coupled with the logic die. In some embodiments, the interface die is an interposer die having various conductive structures (e.g., redistribution layers, vias, interconnects) configured to route electrical signals between the semiconductor dies it carries and higher level circuitry—e.g., a central processing unit (CPU) coupled with the interposer die.

Diagram 300A also illustrates a semiconductor die 301a, which may be an example of or include aspects of the semiconductor die 201b. For example, the semiconductor die 301a includes the substrate 110 including integrated circuitry (not shown). Further, the semiconductor die 301a includes dielectric layers 120c/d formed on both sides of the substrate 110. The semiconductor die 301a may be referred to as a middle die of a stack of semiconductor dies. The semiconductor die 301a includes conductive pads 225 (also identified individually as conductive pads 225c and 225d) in both of the dielectric layers 120c/d such that the semiconductor die 301a can be attached to a semiconductor die underneath (e.g., the semiconductor die 201a) and a semiconductor die above (e.g., semiconductor die 301b as shown in diagrams 300C/D).

Diagram 300B illustrates the semiconductor die 301a has been directly attached to the semiconductor die 201a—e.g., the dielectric layer 120a of semiconductor die 201a and the dielectric layer 120c of the semiconductor die 301a form dielectric-to-dielectric bonding at the bonding interface 205a. Subsequently, the conductive buffer layer 210b is formed on the conductive pads 225d of the semiconductor die 301a. Also illustrated in diagram 300B is the optional sacrificial layer 215b.

Diagram 300C illustrates that another semiconductor die 301b, which may be an example of or include aspects of the semiconductor die 201b. For example, the semiconductor die 301b includes the substrate 110b including integrated circuitry (not shown) and a dielectric layer 120e. The semiconductor die 301b may be referred to as a top die of a stack of semiconductor dies. The semiconductor die 301b includes conductive pads 225 (also identified individually as conductive pads 225e) in its dielectric layer 120. The substrate 110b may be thicker than the substrates of the middle semiconductor dies.

Diagram 300D illustrates the semiconductor die 301b has been directly attached to the semiconductor die 301a—e.g., the dielectric layer 120e of semiconductor die 301b and the dielectric layer 120d of the semiconductor die 301a form another dielectric-to-dielectric bonding at the bonding interface 205b. Subsequently, the stack of semiconductor dies 201a, 301a, and 301b can be brought to an elevated temperature (e.g., post bond annealing process steps) to have the conductive pads 225 of all semiconductor dies (e.g., semiconductor dies 201a, 301a, and 301b) expand (e.g., during the post bond annealing process) to form interconnects. Moreover, the sacrificial layer 215 may decompose at the elevated temperature.

Diagram 300E illustrates a semiconductor die assembly 370 including the semiconductor dies 201a, 301a, and 301b. As a result of the post bond annealing process, the conductive pads 225 from the upper and lower semiconductor dies conjoin to form interconnects 240 (also identified individually as interconnects 240a/b) between the semiconductor dies. Each of the interconnects 240 includes a conductive buffer material (e.g., the conductive buffer material of the conductive buffer layer 210) in addition to the conductive pads (e.g., between the conductive pads) from the upper and lower semiconductor dies. The optional sacrificial layers 215a/b is no longer included in the diagram 300E as they have decomposed during the post bond annealing process as described above. Although the semiconductor die assembly 370 as shown in the diagram 300E includes one middle semiconductor die 301a, the present technology is not limited thereto. For example, in other embodiments, the semiconductor die assembly 370 includes two or more middle semiconductor dies 301a—e.g., four (4), eight (8), twelve (12), or even greater quantity of middle semiconductor dies.

Figure 4:
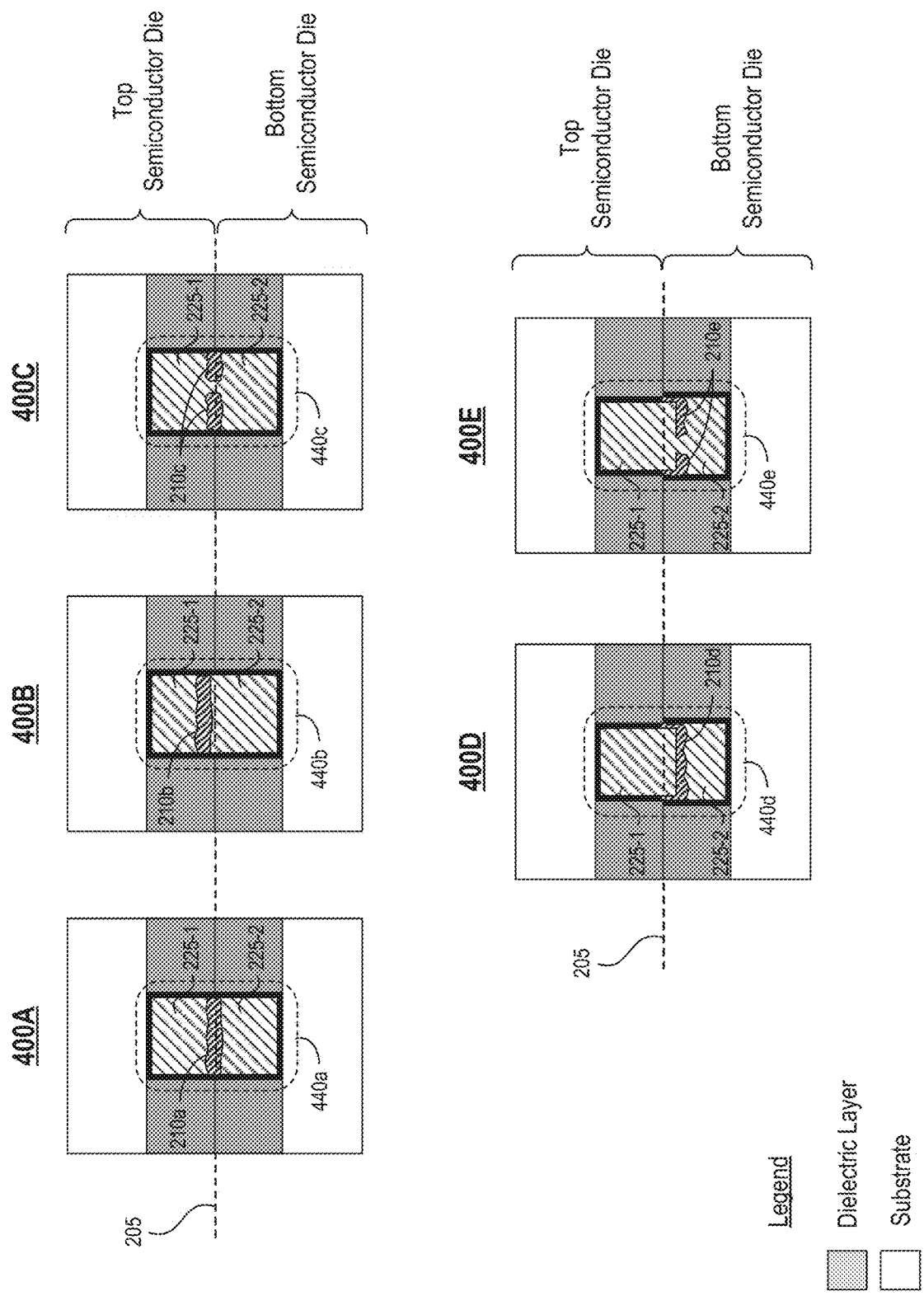
FIG. 4 illustrates cross-sectional schematic diagrams of interconnects for semiconductor die assemblies in accordance with embodiments of the present technology.

FIG. 4 illustrates cross-sectional schematic diagrams 400A through 400E of interconnects 440a-e for semiconductor die assemblies in accordance with embodiments of the present technology. The interconnects 440a-e may be examples of or include aspects of interconnects 140 or 240 described with reference to FIGS. 1 through 3. For example, each of the interconnects 440a-e includes the conductive buffer layer 210 (also identified individually as conductive buffer layer 210a-e) (or the conductive buffer material of the conductive buffer layer 210) in addition to conductive pads 225 (also identified individually as upper conductive pads 225-1 and lower conductive pads 225-2) from the top (upper) semiconductor die (e.g., the semiconductor die 201b, the semiconductor die 301b) and the bottom (lower) semiconductor die (e.g., the semiconductor die 201a) with respect to the bonding interface 205, respectively.

Diagram 400A depicts the interconnect 440a including the conductive buffer layer 210a located generally at the bonding interface 205. Recess depths of the conductive pads 225-1/2 may have been comparable to each other such that the CTE-based expansion of the conductive pads 225-1/2 brings the conductive buffer layer 210a approximately at the bonding interface 205. As depicted in the diagram 400A, the surface of conductive pad 225-1 is separate from the surface of conductive pad 225-2 but the conductive buffer layer 210a electrically couples the conductive pad 225-1 with the conductive pad 225-2 to avoid the interconnect 440a being highly resistive or electrically open.

Diagram 400B depicts the interconnect 440b including the conductive buffer layer 210b located slightly off of the bonding interface 205. At least partially due to the process variations in generating the conductive pads 225-1/2, the recess depths of the conductive pads 225-1/2 may have been dissimilar (e.g., the conductive pad 225-2 has a shallower recess depth than that of the conductive pad 225-1). As a result of the variations in recess depth of the conductive pads 225-1/2, the CTE-based expansion of the conductive pads 225-1/2 may bring the conductive buffer layer 210b off of the bonding interface 205.

Diagram 400C depicts the interconnect 440c including the conductive buffer layer 210c that may be discontinuous at certain regions. In other words, at least a portion of the surface of the conductive pad 225-1 is conjoined to at least another portion of the surface of the conductive pad 225-2—e.g., at least partial metal-to-metal bonding occurred between the conductive pads 225-1 and 225-2. Although the conductive buffer layer 210c is shown generally at the bonding interface 205, the conductive buffer layer 210c may be located off of the bonding interface 205 in view of the variations in recess depth of the conductive pads 225-1/2.

Diagram 400D depicts the interconnect 440d including the conductive buffer layer 210d located below the bonding interface 205. Further, the interconnect 440d includes the conductive pad 225-1 extending past the bonding interface 205. The conductive pad 225-1 may represent a conductive pad protruded above the surface of the dielectric layer, in which the conductive pad is formed—e.g., after completing the CMP process generating the conductive pad. Such a protruded conductive pad may be regarded as an extreme incoming condition for the hybrid bonding process, which tends to hinder forming a robust hybrid bonding interface without the present technology.

Diagram 400D, however, demonstrates that the present technology facilitates overcoming challenges associated with such an extreme condition. For example, the corresponding conductive pad 225-2 has a suitable recess depth to accommodate the protruded conductive pad 225-1—e.g., in view of the widened tolerable limits for the conductive pad coplanarity. Further, the conductive buffer layer 210d can provide a squeezable cushion during the CTE-based expansion of the conductive pads 225-1/2. Accordingly, the interconnect 440d is expected to have similar characteristics as other interconnects (e.g., interconnects 440a-c) in spite of the protruded conductive pad 225-1.

Diagram 400E depicts the interconnect 440e generally similar to the interconnect 440d. Further, similar to the conductive buffer layer 210c, the conductive buffer layer 210e of the interconnect 440e may be discontinuous at certain regions. In other words, at least a portion of the surface of the conductive pad 225-1 is conjoined to at least another portion of the surface of the conductive pad 225-2—e.g., at least partial metal-to-metal bonding occurred between the conductive pads 225-1 and 225-2.

Figure 5:
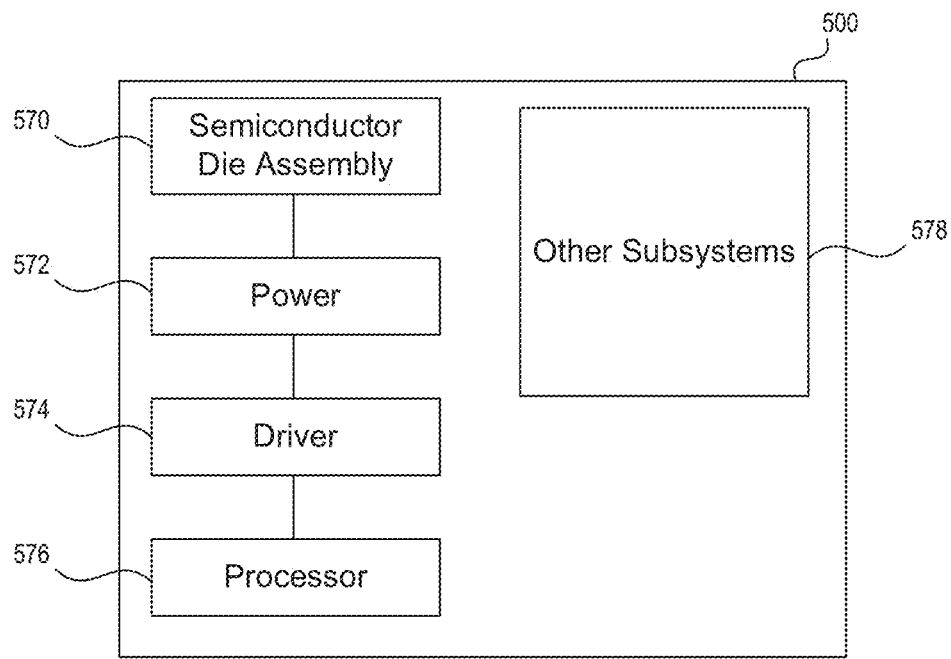
FIG. 5 is a block diagram schematically illustrating a system including a semiconductor die assembly in accordance with embodiments of the present technology.

FIG. 5 is a block diagram schematically illustrating a system 500 including a semiconductor die assembly in accordance with embodiments of the present technology. The system 500 can include a semiconductor device assembly 570, a power source 572, a driver 574, a processor 576, and/or other subsystems or components 578. The semiconductor device assembly 570 can be incorporated into any of a myriad of larger and/or more complex systems, a representative example of which is the system 500 shown schematically in FIG. 5. The semiconductor die assembly 370 described with reference to FIG. 5 may be included in the semiconductor device assembly 570 of the system 500.

The semiconductor device assembly 570 can have features generally similar to the semiconductor die assembly 370 described above with reference to FIGS. 3A-C. For example, the semiconductor device assembly 570 includes two or more semiconductor dies (e.g., the semiconductor dies 201a, 301a, and 301b) that are directly bonded to each other. Further, the semiconductor device assembly 570 includes interconnects formed between the semiconductor dies. Each of the interconnects may include a conductive buffer material in addition to the first and second conductive pads (e.g., between the first and second conductive pads) from the top and bottom semiconductor dies, respectively.

In some embodiments, the semiconductor device assembly 570 includes a first semiconductor die including a first semiconductor substrate, a first dielectric layer over the first semiconductor substrate, and a first copper pad in the first dielectric layer, the first copper pad having a first surface opposite to the first semiconductor substrate. Further, the semiconductor device assembly 570 includes a second semiconductor substrate, a second dielectric layer over the second semiconductor substrate, and a second copper pad in the second dielectric layer, the second copper pad having a second surface opposite to the second semiconductor substrate. Moreover, the first dielectric layer is in direct contact with the second dielectric layer at a bonding interface between the first and second semiconductor dies, and the first and second copper pads form an interconnect between the first and second semiconductor dies, the interconnect having a conductive buffer material between the first and second copper pads. In some embodiments, the conductive buffer layer includes aggregates of conductive particles. In some embodiments, the conductive buffer layer is less dense than the first and second copper pads.

In some embodiments, the conductive buffer material is porous and includes copper particles. In some embodiments, at least a first portion of the first surface is conjoined to at least a second portion of the second surface. In some embodiments, the first surface is separate from the second surface, and where the first copper pad is electrically connected to the second copper pad through the conductive buffer material. In some embodiments, either the first surface or the second surface extends past the bonding interface.

The resulting system 500 can perform any of a wide variety of functions, such as memory storage, data processing, and/or other suitable functions. Accordingly, representative systems 500 can include, without limitation, handheld devices (e.g., mobile phones, tablets, digital readers, and digital audio players), computers, and appliances. Components of the system 500 may be housed in a single unit or distributed over multiple, interconnected units (e.g., through a communications network). The components of the system 500 can also include remote devices and any of a wide variety of computer readable media.

Figure 6:
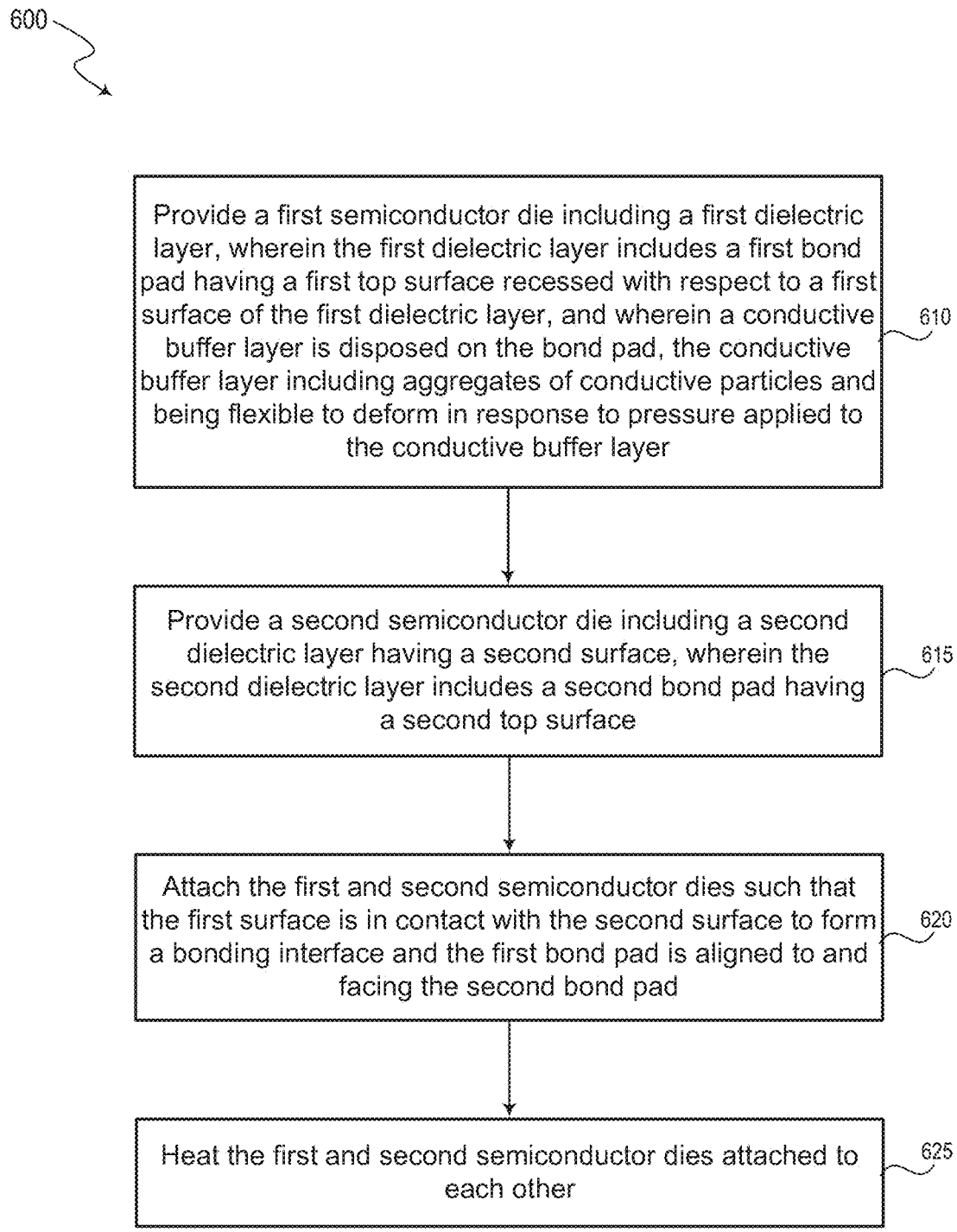
FIG. 6 is a flowchart of a method of forming semiconductor die assemblies in accordance with embodiments of the present technology.

FIG. 6 is a flowchart 600 of a method of forming semiconductor die assemblies in accordance with embodiments of the present technology. The flowchart 600 may include aspects of methods as described with reference to FIGS. 1 through 4.

The method comprises providing a first semiconductor die including a first dielectric layer, where the first dielectric layer includes a first bond pad having a first top surface recessed with respect to a first surface of the first dielectric layer, and where a conductive buffer layer is disposed on the bond pad, the conductive buffer layer being malleable to deform in response to pressure applied to the conductive buffer layer (box 610). The method further comprises providing a second semiconductor die including a second dielectric layer having a second surface, where the second dielectric layer includes a second bond pad having a second top surface (box 615). The method further comprises attaching the first and second semiconductor dies such that the first surface is in contact with the second surface to form a bonding interface and the first bond pad is aligned to and facing the second bond pad (box 620). The method further comprises heating the first and second semiconductor dies attached to each other (box 625).

In some embodiments, a sacrificial layer is disposed between the first top surface of the first bond pad and the conductive buffer layer, and the conductive buffer layer adheres to the sacrificial layer. In some embodiments, heating the first and second semiconductor dies attached to each other includes decomposing the sacrificial layer at a temperature greater than 100° C. In some embodiments, the second top surface of the second bond pad is recessed with respect to the second surface of the second dielectric layer, and both the first and second top surfaces of the first and second bond pads expand toward the bonding interface in response to heating the first and second semiconductor dies.

In some embodiments, at least a first portion of the first top surface is conjoined to at least a second portion of the second top surface as a result of the first and second bond pads expanding toward the bonding interface. In some embodiments, the first top surface is separate from the second top surface after heating the first and second semiconductor dies, and the first bond pad is electrically connected to the second bond pad through the conductive buffer layer. In some embodiments, the second top surface of the second bond pad is protruded with respect to the second surface of the second dielectric layer, and both the first and second top surfaces of the first and second bond pads expand toward each other in response to heating the first and second semiconductor dies.

In some embodiments, at least a first portion of the first top surface is conjoined to at least a second portion of the second top surface as a result of the first and second bond pads expanding toward each other. In some embodiments, the first top surface is separate from the second top surface, and the first bond pad is electrically connected to the second bond pad through the conductive buffer layer.

It should be noted that the methods described above describe possible implementations, and that the operations and the steps may be rearranged or otherwise modified and that other implementations are possible. Furthermore, embodiments from two or more of the methods may be combined. From the foregoing, it will be appreciated that specific embodiments of the technology have been described herein for purposes of illustration, but that various modifications may be made without deviating from the disclosure. In addition, while in the illustrated embodiments certain features or components have been shown as having certain arrangements or configurations, other arrangements and configurations are possible. Moreover, certain aspects of the present technology described in the context of particular embodiments may also be combined or eliminated in other embodiments.

The devices discussed herein, including a semiconductor device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on." The term "exemplary" used herein means "serving as an example, instance, or illustration," and not "preferred" or "advantageous over other examples."

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:

1. A semiconductor die, comprising:
   a semiconductor substrate;
   a dielectric layer over the semiconductor substrate;
   a bond pad in the dielectric layer, the bond pad including a top surface that is recessed with respect to a surface of the dielectric layer opposite to the semiconductor substrate;
   a conductive buffer layer on the bond pad, wherein the conductive buffer layer includes aggregates of conductive particles, and is flexible to deform in response to pressure applied to the conductive buffer layer; and
   a sacrificial layer between the top surface of the bond pad and the conductive buffer layer, wherein the conductive buffer layer adheres to the sacrificial layer, wherein the sacrificial layer is configured to decompose at a temperature greater than 100° C.

2. The semiconductor die of claim 1, wherein the conductive buffer layer is porous such that the aggregates of conductive particles are compressed together in response to the pressure applied to the conductive buffer layer.

3. The semiconductor die of claim 2, wherein the conductive particles includes copper.

4. The semiconductor die of claim 1, wherein the conductive buffer layer is formed based on at least one of:
   depositing conductive particles over the bond pad while blocking the conductive particles from depositing on the surface of the dielectric layer unoccupied by the bond pad;
   selectively sintering conductive particles that have been disposed over the bond pad; or
   selectively spraying a solution including conductive particles over the bond pad.

5. A method, comprising:
   providing a first semiconductor die including a first dielectric layer, wherein the first dielectric layer includes a first bond pad having a first top surface recessed with respect to a first surface of the first dielectric layer, and wherein a conductive buffer layer is disposed on the bond pad, the conductive buffer layer including aggregates of conductive particles and being flexible to deform in response to pressure applied to the conductive buffer layer;
   providing a second semiconductor die including a second dielectric layer having a second surface, wherein the second dielectric layer includes a second bond pad having a second top surface;
   attaching the first and second semiconductor dies such that the first surface is in contact with the second surface to form a bonding interface and the first bond pad is aligned to and facing the second bond pad; and
   heating the first and second semiconductor dies attached to each other.

6. The method of claim 5, wherein a sacrificial layer is disposed between the first top surface of the first bond pad and the conductive buffer layer, and wherein the conductive buffer layer adheres to the sacrificial layer.

7. The method of claim 6, wherein heating the first and second semiconductor dies attached to each other comprises:
   decomposing the sacrificial layer at a temperature greater than 100° C.

8. The method of claim 5, wherein the second top surface of the second bond pad is recessed with respect to the second surface of the second dielectric layer, and wherein both the first and second top surfaces of the first and second bond pads expand toward the bonding interface in response to heating the first and second semiconductor dies.

9. The method of claim 8, wherein at least a first portion of the first top surface is conjoined to at least a second portion of the second top surface as a result of the first and second bond pads expanding toward the bonding interface.

10. The method of claim 8, wherein the first top surface is separate from the second top surface after heating the first and second semiconductor dies, and wherein the first bond pad is electrically connected to the second bond pad through the conductive buffer layer.

11. The method of claim 5, wherein the second top surface of the second bond pad is protruded with respect to the second surface of the second dielectric layer, and wherein both the first and second top surfaces of the first and second bond pads expand toward each other in response to heating the first and second semiconductor dies.

12. The method of claim 11, wherein at least a first portion of the first top surface is conjoined to at least a second portion of the second top surface as a result of the first and second bond pads expanding toward each other.

13. The method of claim 11, wherein the first top surface is separate from the second top surface, and wherein the first bond pad is electrically connected to the second bond pad through the conductive buffer layer.

14. A semiconductor die assembly, comprising:
 a first semiconductor die including:
  a first semiconductor substrate;
  a first dielectric layer over the first semiconductor substrate; and
  a first copper pad in the first dielectric layer, the first copper pad having a first surface opposite to the first semiconductor substrate; and
 a second semiconductor die including:
  a second semiconductor substrate;
  a second dielectric layer over the second semiconductor substrate; and
  a second copper pad in the second dielectric layer, the second copper pad having a second surface opposite to the second semiconductor substrate, wherein:
 the first dielectric layer is in direct contact with the second dielectric layer at a bonding interface between the first and second semiconductor dies; and
 the first and second copper pads form an interconnect between the first and second semiconductor dies, the interconnect having a conductive buffer material between the first and second copper pads, wherein the conductive buffer layer includes aggregates of conductive particles, and wherein the conductive buffer layer is less dense than the first and second copper pads.

15. The semiconductor die assembly of claim 14, wherein the conductive buffer material is porous and includes copper particles.

16. The semiconductor die assembly of claim 14, wherein at least a first portion of the first surface is conjoined to at least a second portion of the second surface.

17. The semiconductor die assembly of claim 14, wherein the first surface is separate from the second surface, and wherein the first copper pad is electrically connected to the second copper pad through the conductive buffer material.

18. The semiconductor die assembly of claim 14, wherein either the first surface or the second surface extends past the bonding interface.

* * * * *